(12) United States Patent
Gai et al.

(10) Patent No.: US 11,263,948 B2
(45) Date of Patent: Mar. 1, 2022

(54) DISPLAY APPARATUS AND CONTROL METHOD

(71) Applicant: BOE TECHNOLOGY GROUP CO., LTD., Beijing (CN)

(72) Inventors: Cuili Gai, Beijing (CN); Yicheng Lin, Beijing (CN); Ling Wang, Beijing (CN); Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 136 days.

(21) Appl. No.: 16/622,488

(22) PCT Filed: Mar. 18, 2019

(86) PCT No.: PCT/CN2019/078491
§ 371 (c)(1),
(2) Date: Dec. 13, 2019

(87) PCT Pub. No.: WO2019/179393
PCT Pub. Date: Sep. 26, 2019

(65) Prior Publication Data
US 2020/0410918 A1 Dec. 31, 2020

(30) Foreign Application Priority Data
Mar. 19, 2018 (CN) .......................... 201810227517.2

(51) Int. Cl.
*G09G 3/20* (2006.01)
*G09G 3/32* (2016.01)
(52) U.S. Cl.
CPC ............. *G09G 3/2003* (2013.01); *G09G 3/32* (2013.01); *G09G 2300/0452* (2013.01);
(Continued)
(58) Field of Classification Search
None
See application file for complete search history.

(56) References Cited

U.S. PATENT DOCUMENTS

| 10,460,701 B2* | 10/2019 | Luo .......................... G09G 3/20 |
| 2002/0047550 A1* | 4/2002 | Tanada .................. G09G 3/2011 |
| | | 315/155 |

(Continued)

FOREIGN PATENT DOCUMENTS

| CN | 1942030 A | 4/2007 |
| CN | 103310752 A | 9/2013 |

(Continued)

OTHER PUBLICATIONS

International Search Report and Written Opinion issued in corresponding International Application No. PCT/CN2019/078491, dated Jun. 17, 2019, with English language translation.

(Continued)

*Primary Examiner* — Patrick N Edouard
*Assistant Examiner* — Peijie Shen
(74) *Attorney, Agent, or Firm* — McDermott Will and Emery LLP

(57) ABSTRACT

A display apparatus and a control method are disclosed. The display apparatus includes a plurality of sub-pixels, at least one photosensitive assembly, and a processor. Each photosensitive assembly is configured to detect and output actual luminance value(s) of at least one sub-pixel. The processor is configured to obtain a display compensation map corresponding to a target sub-pixel according to actual luminance values of the target sub-pixel that are acquired respectively in cases where a plurality of preset display data are input to the target sub-pixel, and target luminance values of the target sub-pixel that are obtained respectively in cases where the plurality of preset display data are input to the target sub-pixel.

17 Claims, 8 Drawing Sheets

(52) U.S. Cl.
CPC ............ *G09G 2310/027* (2013.01); *G09G 2310/0278* (2013.01); *G09G 2310/08* (2013.01); *G09G 2320/0673* (2013.01)

(56) References Cited

U.S. PATENT DOCUMENTS

| | | |
|---|---|---|
| 2003/0047736 A1 | 3/2003 | Hayashi et al. |
| 2004/0257352 A1* | 12/2004 | Naugler, Jr. ......... G09G 3/3291 345/204 |
| 2005/0225519 A1* | 10/2005 | Naugler ............... G09G 3/3233 345/77 |
| 2006/0038758 A1* | 2/2006 | Routley ............... G09G 3/3233 345/81 |
| 2007/0069632 A1 | 3/2007 | Peng |
| 2009/0243498 A1* | 10/2009 | Childs ................. G09G 3/3233 315/169.3 |
| 2014/0300592 A1 | 10/2014 | Lee et al. |
| 2016/0196793 A1 | 7/2016 | Ku |
| 2017/0163266 A1 | 6/2017 | Chen et al. |
| 2017/0206825 A1* | 7/2017 | Cha ...................... G09G 3/3208 |
| 2017/0249890 A1* | 8/2017 | Yoo ...................... G09G 3/2074 |
| 2019/0057657 A1 | 2/2019 | Liu et al. |
| 2019/0164493 A1* | 5/2019 | Liu ....................... G09G 3/3258 |
| 2019/0237001 A1* | 8/2019 | Lin ....................... G09G 3/3208 |
| 2019/0385544 A1* | 12/2019 | Tan .......................... G09G 5/10 |

FOREIGN PATENT DOCUMENTS

| | | |
|---|---|---|
| CN | 105070248 A | 11/2015 |
| CN | 106887212 A | 6/2017 |
| CN | 106981266 A | 7/2017 |
| CN | 107731880 A | 2/2018 |
| CN | 108428721 A | 8/2018 |

OTHER PUBLICATIONS

First Chinese Office Action issued in corresponding Chinese Application No. 201810227517.2, dated Apr. 3, 2020, with English language translation.

* cited by examiner

DISPLAY APPARATUS AND CONTROL METHOD

CROSS-REFERENCE TO RELATED APPLICATIONS

This application is a national phase entry under 35 USC 371 of International Patent Application No. PCT/CN2019/078491 filed on Mar. 18, 2019, which claims priority to Chinese Patent Application No. 201810227517.2, submitted to Chinese Patent Office on Mar. 19, 2018, titled "DISPLAY APPARATUS AND CONTROL METHOD", which is incorporated herein by reference in their entirety.

TECHNICAL FIELD

The present disclosure relates to the field of display technologies, and in particular, to a display apparatus and a control method.

BACKGROUND

Organic light emitting diode (OLED) display apparatuses have been widely used in various display apparatuses including electronic products, such as computers and mobile phones, because of their advantages such as self-emission, high luminous efficiency, short response time, high definition and high contrast.

The OLED display apparatuses are mainly divided into two types: active matrix OLED (AMOLED) display apparatuses and passive matrix OLED (PMOLED) display apparatuses. The AMOLED display apparatuses are increasingly recognized since they have low manufacturing costs and a large operating temperature range, are able to be used for portable devices that are driven by direct currents, and are able to be used for large-size display apparatuses with high definition.

SUMMARY

In one aspect, embodiments of the present disclosure provide a display apparatus. The display apparatus includes a plurality of sub-pixels, at least one photosensitive assembly and a processor. Each photosensitive assembly is configured to detect and output actual luminance value(s) of at least one sub-pixel. The processor is configured to obtain a display compensation map corresponding to a target sub-pixel according to actual luminance values of the target sub-pixel that are acquired respectively in cases where a plurality of preset display data are input to the target sub-pixel, and target luminance values of the target sub-pixel that are obtained respectively in cases where the plurality of preset display data are input to the target sub-pixel. The display compensation map reflects a correspondence relationship between each initial display datum in an initial display data set and a corresponding compensated display datum in a compensated display data set, and the target sub-pixel is any one of the plurality of sub-pixels.

In some embodiments, the display apparatus further includes a timing controller coupled to the processor and a data driving circuit coupled to the timing controller. The timing controller is configured to, according to the display compensation map and an initial display datum in the initial display data set, output a corresponding compensated display datum in the compensated display data set during a display phase of the target sub-pixel. The data driving circuit is configured to apply a pixel voltage to the target sub-pixel according to the corresponding compensated display datum in the compensated display data set.

In some embodiments, the display apparatus further includes a detecting integrated circuit. The detecting integrated circuit is coupled to the at least one photosensitive assembly and the processor, and the detecting integrated circuit is configured to output actual luminance values output by the at least one photosensitive assembly to the processor.

In some embodiments, each photosensitive assembly includes a photosensitive device and a first transistor. A photosensitive region of the photosensitive device is at least partially opposite to a light exit region of the at least one sub-pixel. A control electrode of the first transistor is coupled to a first scanning signal line, a first electrode of the first transistor is coupled to the photosensitive device, and a second electrode of the first transistor is coupled to an output terminal of the photosensitive assembly.

In some embodiments, the photosensitive device includes a PIN photodiode.

In some embodiments, each of the plurality of sub-pixels includes a light-emitting device and a pixel driving circuit coupled to the light-emitting device. The pixel driving circuit includes a second transistor, a third transistor, a fourth transistor, and a storage capacitor. A control electrode of the second transistor is coupled to a second scanning signal line, a first electrode of the second transistor is coupled to a data line, and a second electrode of the second transistor is coupled to a first node. A control electrode of the third transistor is coupled to the first node, a first electrode of the third transistor is coupled to a first voltage terminal, and a second electrode of the third transistor is coupled to a second node. A control electrode of the fourth transistor is coupled to the second scanning signal line, a first electrode of the fourth transistor is coupled to the second node, and a second electrode of the fourth transistor is coupled to a sensing signal line. One end of the storage capacitor is coupled to the first node, and another end of the storage capacitor is coupled to the second node. A first electrode of the light-emitting device is coupled to the second node, and a second electrode of the light-emitting device is coupled to a second voltage terminal.

In some embodiments, each photosensitive assembly is coupled to a detecting integrated circuit through a sensing signal line that is coupled to pixel driving circuit(s) in corresponding sub-pixel(s).

In some embodiments, each sub-pixel corresponds to one photosensitive assembly. Or, the plurality of sub-pixels include at least one sub-pixel group, and each sub-pixel group corresponds to one photosensitive assembly. Each sub-pixel group includes at least two sub-pixels that are adjacently arranged.

In some embodiments, each photosensitive assembly corresponds to three sub-pixels that are adjacently arranged, and the three sub-pixels include a red sub-pixel, a blue sub-pixel, and a green sub-pixel. Or, each photosensitive assembly corresponds to four sub-pixels that are adjacently arranged, and the four sub-pixels include a red sub-pixel, a blue sub-pixel, a green sub-pixel, and a white sub-pixel.

In another aspect, some embodiments of the present disclosure provide a control method of a display apparatus. The control method includes: a step of acquiring actual luminance values of a target sub-pixel respectively in cases where a plurality of preset display data are input to the target sub-pixel; a step of obtaining target luminance values of the target sub-pixel respectively in cases where the plurality of preset display data are input to the target sub-pixel; and a step of obtaining a display compensation map corresponding to the target sub-pixel according to the plurality of preset display data, the actual luminance values corresponding to the plurality of preset display data and the target luminance values corresponding to the plurality of preset display data. The display compensation map reflects a correspondence relationship between each initial display datum in an initial display data set and a corresponding display datum in a compensated display data set. The target sub-pixel is any one of the plurality of sub-pixels.

In some embodiments, each preset display data is a display datum corresponding to a gamma reference voltage.

In some embodiments, the target luminance values of the target sub-pixel obtained respectively in cases where the plurality of preset display data are input to the target sub-pixel, includes a luminance value corresponding to each preset display datum on a gamma curve; an average luminance value of actual luminance values, which are within a first luminance value range, in a plurality of actual luminance values acquired respectively in cases where a preset display datum is input to a plurality of sub-pixels with a same color as the target sub-pixel; or an average luminance value of the plurality of actual luminance values acquired respectively in cases where a preset display datum is input to the plurality of sub-pixels with a same color as the target sub-pixel. The first luminance value range includes, in a plurality of preset luminance value ranges, a luminance value range in which actual luminance values of the plurality of sub-pixels with a same color as the target sub-pixel are concentrated.

In some embodiments, the step of acquiring actual luminance values of a target sub-pixel respectively in cases where a plurality of preset display data are input to the target sub-pixel, includes: a step of according to a preset condition, acquiring the actual luminance values of the target sub-pixel respectively in cases where the plurality of preset display data are input to the target sub-pixel.

In some embodiments, the step of obtaining a display compensation map corresponding to the target sub-pixel according to the plurality of preset display data, the actual luminance values corresponding to the plurality of preset display data and the target luminance values corresponding to the plurality of preset display data, includes: a step of fitting an actual luminance value curve of the target sub-pixel according to a correspondence relationship between each preset display datum and a corresponding actual luminance value; a step of fitting a target luminance value curve of the target sub-pixel according to a correspondence relationship between each preset display datum and a corresponding target luminance value; a step of obtaining a target luminance value corresponding to each initial display datum in the initial display data set from the target luminance value curve; and a step of obtaining, from the actual luminance value curve, a display datum corresponding to an actual luminance value that is equal to the target luminance value, as a compensated display datum corresponding to the initial display datum. Compensated display data corresponding to initial display data constitute the compensated display data set.

In some embodiments, the second electrode of the first transistor in the photosensitive assembly is coupled to a detecting integrated circuit through a sensing signal line.

In some embodiments, pixel driving circuit(s) in the at least one sub-pixel are coupled to a corresponding photosensitive assembly through a sensing signal line.

In some embodiments, the processor is configured to perform the following steps: a step of fitting an actual luminance value curve of the target sub-pixel according to a correspondence relationship between each preset display datum and a corresponding actual luminance value; a step of fitting a target luminance value curve of the target sub-pixel according to a correspondence relationship between each preset display datum and a corresponding target luminance value; a step of obtaining a target luminance value corresponding to each initial display datum in the initial display data set from the target luminance value curve; and a step of obtaining, from the actual luminance value curve, a display datum corresponding to an actual luminance value that is equal to the target luminance value, as a compensated display datum corresponding to the initial display datum.

In some embodiments, the control method further comprising: a step of driving the target sub-pixel according to a compensated display datum in the compensated display data set.

In yet another aspect, some embodiments of the present disclosure provide a computer product including one or more processors. The one or more processors are configured to execute computer instructions to perform one or more steps in the control method of the display apparatus as described above.

In yet another aspect, some embodiments of the present disclosure provide a non-transitory computer readable storage medium storing computer instructions. The computer instructions are configured to be executed by a processor of a display apparatus. The computer instructions include instructions for: receiving actual luminance values of a target sub-pixel acquired respectively in cases where a plurality of preset display data are input to the target sub-pixel; receiving target luminance values of the target sub-pixel obtained respectively in cases where the plurality of preset display data are input to the target sub-pixel; and obtaining a display compensation map corresponding to the target sub-pixel according to the plurality of preset display data, the actual luminance values corresponding to the plurality of preset display data and the target luminance values corresponding to the plurality of preset display data. The display compensation map reflects a correspondence relationship between each initial display datum in an initial display data set and a corresponding display datum in a compensated display data set, and the target sub-pixel is any one of the plurality of sub-pixels.

In yet another aspect, some embodiments of the present disclosure provide a computer program. The computer program is loaded into the processor and the processor may perform the control method of the display apparatus as described above.

BRIEF DESCRIPTION OF THE DRAWINGS

In order to describe technical solutions in some embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of some embodiments of the present disclosure by a person of ordinary skill in the art without paying any creative effort shall be included in the protection scope of the present disclosure.

Each sub-pixel of the AMOLED display apparatus is provided with a driving transistor that is configured to provide a current for driving a light-emitting device to emit light. In one aspect, the driving transistors are prone to have non-uniformity in electrical parameters such as a threshold voltage (usually represented by $V_{th}$) due to their production process, manufacturing material, structural design and the like. This non-uniformity may cause differences in currents in and luminance of the light-emitting devices that are driven by the respective driving transistors, so that a non-uniform luminance phenomenon (i.e., a Mura phenomenon) may occur in an image displayed by the AMOLED display apparatus. In another aspect, in a case where voltages are applied to the driving transistors for a long time or the driving transistors are at a high temperature for a long time, the threshold voltages of the driving transistors may shift. If threshold-voltage shifts of the driving transistors in different sub-pixels are different, display luminance of the different sub-pixels will be also different, and thus the Mura phenomenon may occur in a displayed image. In yet another aspect, a power line in the AMOLED display apparatus has a certain resistance, so that a supply voltage applied to a driving transistor proximate to a power supply position is higher than a supply voltage applied to a driving transistor distant from the power supply position (also referred to as an IR Drop phenomenon, or a resistance drop phenomenon). As a result, currents in the driving transistors at different positions are different, and thus the Mura phenomenon may occur in a displayed image. In addition, other factors such as aging of the structure of the light-emitting device may also cause the non-uniform luminance of an image displayed by the AMOLED display apparatus.

Therefore, before the AMOLED display apparatus is delivered from the factory or after the AMOLED display apparatus is used for a period of time, it is necessary to detect and compensate the luminance of the sub-pixels in the AMOLED display apparatus to ensure that luminance of the image displayed by the AMOLED display apparatus is uniform.

Figure 1:
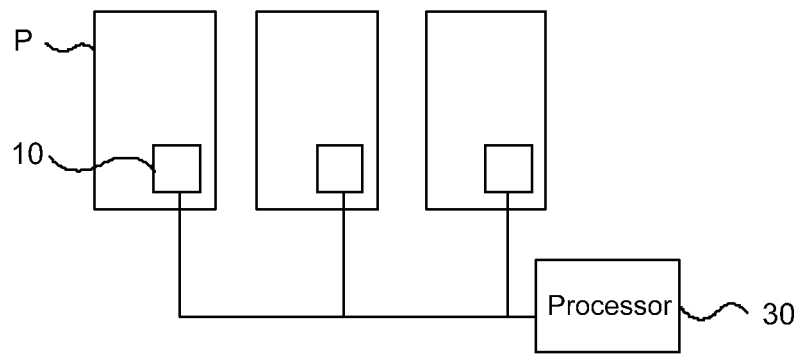
FIG. 1 is a schematic structural diagram of a display apparatus, according to some embodiments of the present disclosure.

Based on this, referring to FIG. 1, some embodiments of the present disclosure provide a display apparatus. The display apparatus includes a plurality of sub-pixels P, at least one photosensitive assembly 10, and a processor 30.

Each photosensitive assembly 10 in the at least one photosensitive assembly 10 corresponds to at least one sub-pixel P. The photosensitive assembly 10 is configured to detect and output an actual luminance value of corresponding sub-pixel(s) P. Optionally, The photosensitive assembly 10 is at least partially opposite to a light exit region of each corresponding sub-pixel P, so that the actual luminance value of the corresponding sub-pixel P may be detected by the photosensitive assembly 10.

The processor 30 is configured to obtain a display compensation map corresponding to a target sub-pixel according to actual luminance values of the target sub-pixel that are respectively acquired in cases where a plurality of preset display data are input to the target sub-pixel, and target luminance values of the target sub-pixel that are respectively obtained in cases where the plurality of preset display data are input to the target sub-pixel. The display compensation map reflects a correspondence relationship between an initial display data set and a compensated display data set. In this case, the target sub-pixel may be driven according to a compensated display datum in the compensated display data set.

Here, the target sub-pixel is any sub-pixel to be compensated in the display apparatus. Each initial display datum in the initial display data set is an uncompensated display datum used for driving the target sub-pixel to emit light. Each compensated display datum in the compensated data set is a display datum obtained after a corresponding initial display datum is compensated. Each preset display datum, each initial display datum, and each compensated display datum are all within a value range of display data of sub-pixels. In addition, the plurality of preset display data are in one-to-one correspondence with a plurality of actual luminance values, and the plurality of preset display data are also in one-to-one correspondence with a plurality of target luminance values. The initial display data are in one-to-one correspondence with the compensated display data.

In some embodiments of the present disclosure, the photosensitive assembly 10 in the display apparatus may accurately detect the actual luminance value of the corresponding sub-pixel P. Moreover, a display compensation map corresponding to the target sub-pixel may be obtained according to each preset display datum, the actual luminance value corresponding to each preset display datum and the target luminance value corresponding to each preset display datum. In this way, the compensated display data of the target sub-pixel may be obtained according to the initial display data of the target sub-pixel during a display process of the display apparatus. The target sub-pixel is driven according to the compensated display data, and luminance adjustment of the sub-pixel may be achieved. In some embodiments of the present disclosure, luminance of the sub-pixel P is directly detected by the photosensitive assembly 10, and a detection result is able to directly reflect influence of factors, such as aging of the structure of the light-emitting device, resistance drop of the power line and threshold voltage shift, on non-uniform luminance of the sub-pixel. Therefore, accuracy of luminance compensation of the sub-pixel P may be further improved. As a result, a problem of the Mura of the display apparatus may be solved. That is, the problem of the Mura of the display apparatus may be solved more comprehensively and essentially.

Figure 2:
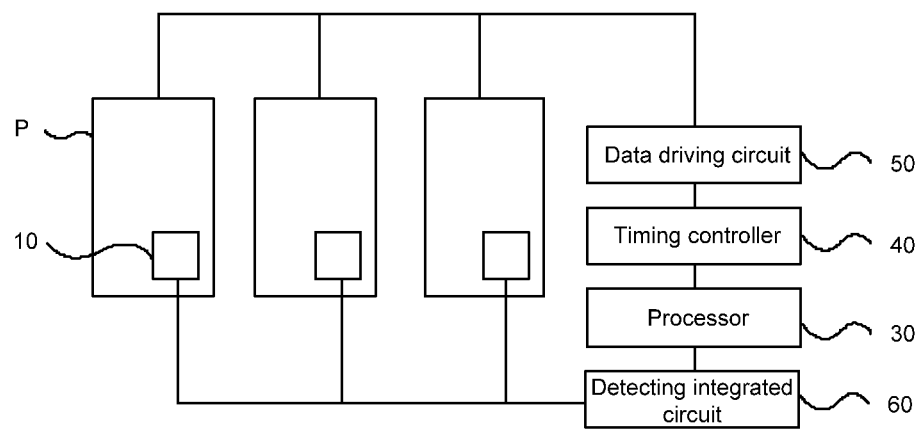
FIG. 2 is another schematic structural diagram of a display apparatus, according to some embodiments of the present disclosure.

Referring to FIG. 2, in some embodiments, the display apparatus further includes a timing controller 40 coupled to the processor 30, and a data driving circuit 50 coupled to the timing controller 40. The timing controller 40 is configured to obtain and output a compensated display datum in the compensated display data set according to the display compensation map during a display phase of the target sub-pixel. The data driving circuit 50 is configured to apply a pixel voltage to the target sub-pixel according to the compensated display datum in the compensated display data set.

It will be noted that the display compensation map, for example, is stored in the timing controller 40, or for example, is separately stored in a memory card coupled to the processor 30 or in a storage region of the processor 30. For example, the display compensation map is separately stored in the storage region of the processor 30. In this way, during the display process of the display apparatus, the timing controller 40 calls the display compensation map from the storage region of the processor 30 to obtain the compensated display datum corresponding to the target sub-pixel, and outputs the compensated display datum to the data driving circuit 50. Some embodiments of the present disclosure do not specifically limit the storage manner of the display compensation map, which may be selected and set according to the needs in practice.

With continued reference to FIG. 2, in some embodiments, the display apparatus further includes a detecting integrated circuit 60 (also referred to as a detecting IC). The detecting integrated circuit 60 is coupled to the at least one photosensitive assembly 10 and the processor 30. The detecting integrated circuit 60 is configured to output the actual luminance values output by the at least one photosensitive assembly 10 to the processor 30.

Optionally, a coupling between the detecting integrated circuit 60 and the at least one photosensitive assembly 10 is realized using signal line(s). For example, each photosensitive assembly 10 is coupled to the detecting integrated circuit 60 through one signal line. Or, photosensitive assemblies 10 corresponding to each row of the sub-pixels are coupled to the detecting integrated circuit 60 through one signal line. Or, photosensitive assemblies 10 corresponding to each column of the sub-pixels are coupled to the detecting integrated circuit 60 through one signal line. In this way, the detecting integrated circuit 60 may receive electric signals corresponding to the actual luminance values output by the photosensitive assembly(s) 10 coupled thereto through the signal line(s), and may convert the electric signals. For example, the detecting integrated circuit 60 converts analog electric signals output by the photosensitive component 10 into digital electric signals, and outputs the converted digital electric signals to the processor 30. In this way, it is convenient for the processor 30 to digitally process the digital electric signals.

In some embodiments, structures of the photosensitive assembly 10 may be various. Some embodiments of the present disclosure do not limit the structure of the photosensitive assembly 10, as long as the photosensitive assembly 10 may detect and output the actual luminance value(s) of the corresponding sub-pixel(s) P.

Figure 3:
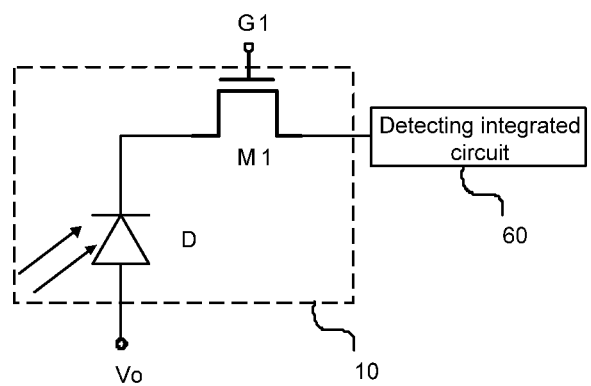
FIG. 3 is a schematic structural diagram of a photosensitive assembly, according to some embodiments of the present disclosure.
Figure 4:
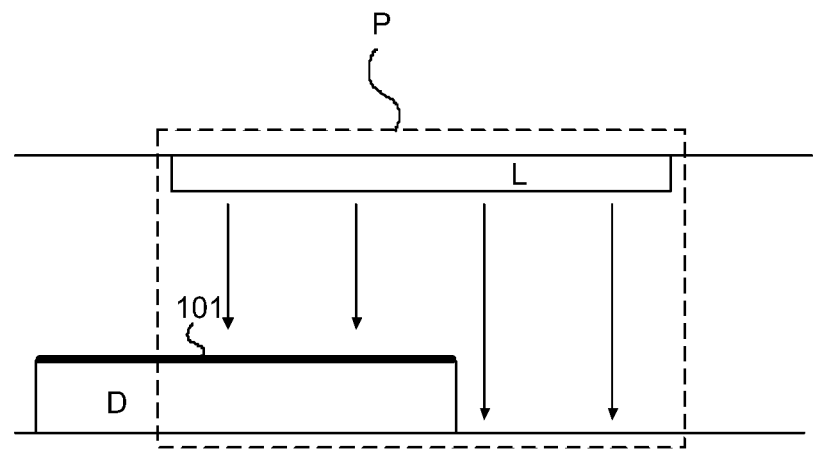
FIG. 4 is a diagram showing a correspondence relationship between a light exit region of a sub-pixel and a photosensitive region of a photosensitive device in a display apparatus, according to some embodiments of the present disclosure.

For example, as shown in FIG. 3, each photosensitive assembly 10 includes a first transistor M1 and a photosensitive device D. As shown in FIG. 4, a photosensitive region 101 of the photosensitive device D is at least partially opposite to the light exit region of each corresponding sub-pixel P. A control electrode of the first transistor M1 is coupled to a first scanning signal line G1, a first electrode of the first transistor M1 is coupled to the photosensitive device D, and a second electrode of the first transistor M1 is coupled to an output terminal. Here, the output terminal coupled to the second electrode of the first transistor M1 is an output terminal of the photosensitive assembly 10. That is, the output terminal is a node at which the photosensitive assembly 10 is configured to be coupled to the detecting integrated circuit 60.

Referring to FIG. 4, the photosensitive region 101 of the photosensitive device D is a region of the photosensitive device D for collecting optical signals. The light exit region of the sub-pixel P is a region of the sub-pixel P from which light may exit (for example, an opening region of the sub-pixel P where a light-emitting device L is located). That the photosensitive region 101 of the photosensitive device D is at least partially opposite to the light exit region of each corresponding sub-pixel P, represents that an orthographic projection of the photosensitive region 101 of the photosensitive device D on a plane parallel to a display surface of the display apparatus partially overlaps an orthographic projection of the light exit region of the corresponding sub-pixel P on the plane. In this way, it may be ensured that the photosensitive region 101 of each photosensitive device D efficiently collects optical signals emitted from the corresponding sub-pixel(s) P. Optionally, the photosensitive device D is provided as a photodiode (also referred to as a photosensitive diode), such as a PIN photodiode. The photosensitive device D is of course not specifically limited in some embodiments of the present disclosure, and can be selected and set according to the needs of the display apparatus in practice.

In a case where a PIN photodiode is used as the photosensitive device D, as shown in FIG. 3, a positive electrode of the PIN photodiode is coupled to a voltage terminal Vo. The voltage terminal Vo is configured to supply a low level voltage (for example, −5V to 0V) to the positive electrode of the PIN photodiode. In this way, a voltage on the positive electrode of the PIN photodiode is lower than a voltage on a negative electrode of the PIN photodiode, and the PIN photodiode is in a state of reverse bias. In this case, the PIN photodiode may accurately detect the actual luminance value(s) of the corresponding sub-pixel(s) P, convert the detected actual luminance value(s) into electric signal(s), and output the electric signal(s).

It will be noted that, in some embodiments, the display apparatus is, for example, a liquid crystal display (LCD). For another example, the display apparatus is a self-luminous display apparatus, such as an organic light emitting diode (OLED) display apparatus or a quantum dot light-emitting display apparatus. The display apparatus is not specifically limited in some embodiments of the present disclosure.

Hereinafter, some embodiments of the present disclosure will be described in detail by taking an example in which the display apparatus is an OLED display apparatus.

Figure 5:
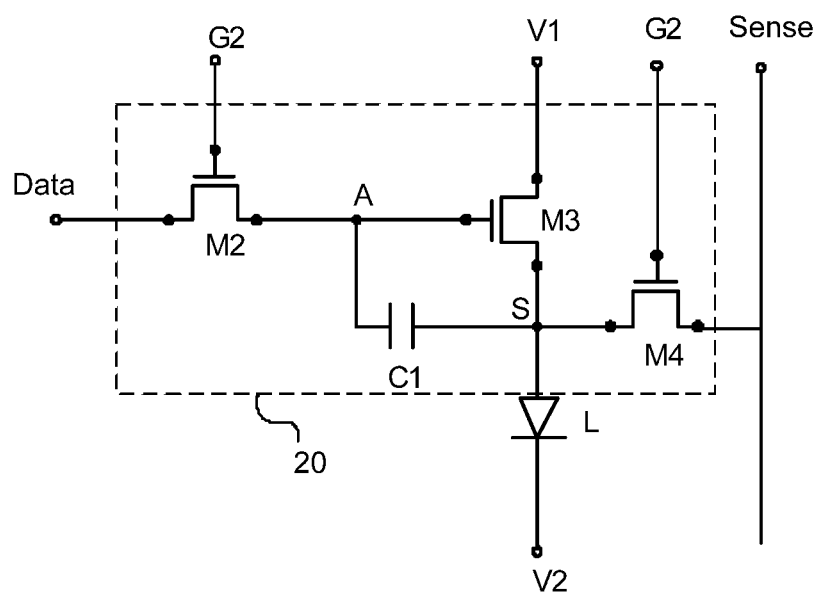
FIG. 5 is a schematic structural diagram of a pixel driving circuit, according to some embodiments of the present disclosure.

Referring to FIG. 5, each sub-pixel P of the OLED display apparatus includes a light-emitting device L and a pixel driving circuit 20 that is coupled to the light-emitting device L. The pixel driving circuit 20 includes a second transistor M2, a third transistor M3, a fourth transistor M4, and a storage capacitor C1. A control electrode of the second transistor M2 is coupled to a second scanning signal line G2, a first electrode of the second transistor M2 is coupled to a data line Date, and a second electrode of the second transistor M2 is coupled to a first node A. A control electrode of the third transistor M3 is coupled to the first node A, a first electrode of the third transistor M3 is coupled to a first voltage terminal V1 (for example, a high level voltage terminal OVDD), and a second electrode of the third transistor M3 is coupled to a second node S. A control electrode of the fourth transistor M4 is coupled to the second scanning signal line G2, a first electrode of the fourth transistor M4 is coupled to the second node S, and a second electrode of the fourth transistor M4 is coupled to a sensing signal line Sense. One end of the storage capacitor C1 is coupled to the first node A, and the other end of the storage capacitor C1 is coupled to the second node S. A first electrode of the light-emitting device L (for example, an OLED) is coupled to the second node S, and a second electrode of the light-emitting device L is coupled to a second voltage terminal V2 (for example, a low level voltage terminal OVSS).

Figure 6:
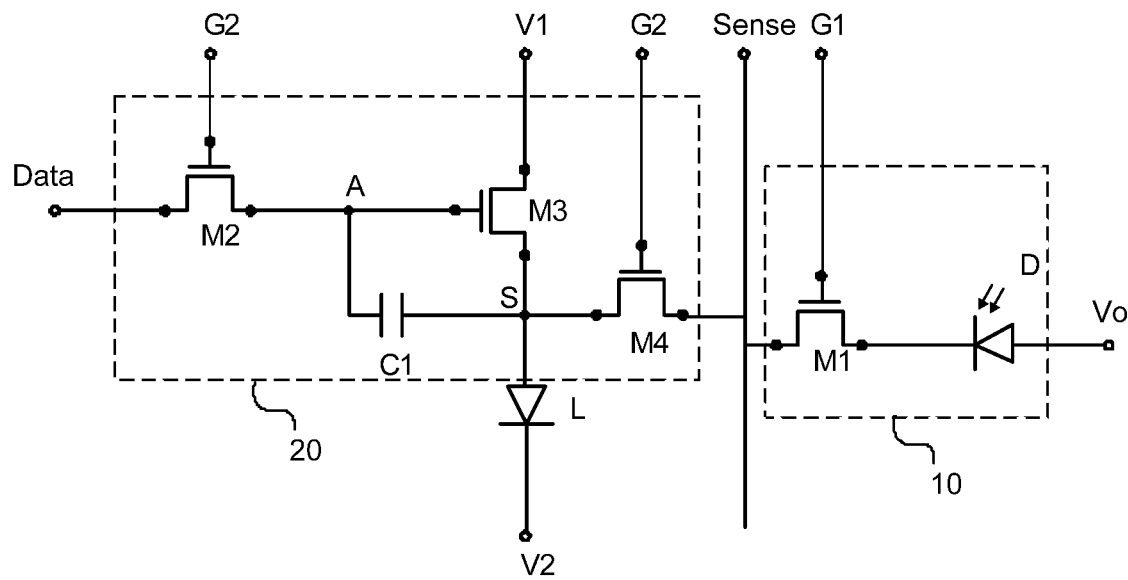
FIG. 6 is a circuit diagram showing a connection of a pixel driving circuit and a photosensitive assembly, according to some embodiments of the present disclosure.

In some embodiments, as shown in FIG. 6, each photosensitive assembly 10 is coupled to the detecting integrated circuit 60 through a sensing signal line Sense that is coupled to a pixel driving circuit 20 in a corresponding sub-pixel. That is, a signal line that couples the photosensitive assembly 10 to the detecting integrated circuit 60 is a same line as the sensing signal line Sense coupled to the pixel driving circuit 20 in the sub-pixel corresponding to the photosensitive assembly 10. Therefore, the total number of signal lines used in the display apparatus may be effectively reduced, and the wiring design of the display apparatus may be simplified. It will be noted that different photosensitive assemblies 10 are respectively coupled to different sensing signal lines Sense, or different photosensitive assemblies 10 are coupled to a same sensing signal line Sense, either of which is allowed. Some embodiments of the present disclosure are not limited thereto.

For example, as shown in FIG. 6, the second electrode of the first transistor M1 in the photosensitive assembly 10 is coupled to the detecting integrated circuit (not shown in FIG. 6) through the sensing signal line Sense.

In some embodiments, correspondence relationships between the photosensitive assembly 10 and the sub-pixel(s) P may be various. For example, the correspondence relationships may be implemented by using the following structures, which are not limited thereto. The correspondence relationships may be implemented by using other structures than the following structures. However, it will be noted that, regardless of whether the photosensitive assemblies 10 and the sub-pixels P are in a one-to-one relationship or a one-to-many relationship, there is a need to ensure that light exiting from each sub-pixel P is able to be incident on the photosensitive device D in the photosensitive assembly 10 corresponding to the sub-pixel.

Figure 7:
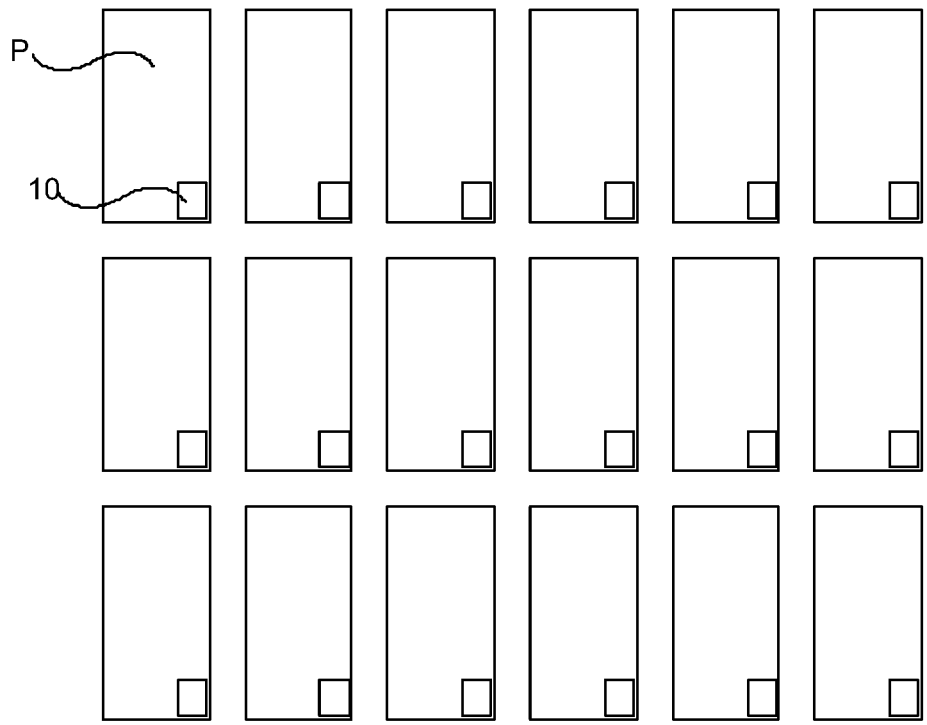
FIG. 7 is a distribution diagram of photosensitive assemblies in a display apparatus, according to some embodiments of the present disclosure.

Optionally, as shown in FIG. 7, each sub-pixel P corresponds to one photosensitive assembly 10. That is, different sub-pixels P respectively correspond to different photosensitive assemblies 10.

Here, the photosensitive assemblies 10 and the sub-pixels P are arranged in a one-to-one manner. In a process of detecting the actual luminance value of each sub-pixel P, a plurality of sub-pixels P may separately emit light, or all of the plurality of sub-pixels emit light simultaneously. For example, when all of the plurality of sub-pixels P emit light simultaneously, a plurality of photosensitive assemblies 10 simultaneously detect the actual luminance values of the plurality of sub-pixels P. In this way, time for luminance detection may be saved.

Optionally, as shown in FIGS. 8 to 11, one photosensitive assembly 10 corresponds to two or more sub-pixels P. In this case, the plurality of sub-pixels P may be divided into at least one sub-pixel group 200. Each sub-pixel group 200 corresponds to one photosensitive assembly 10. Each sub-pixel group 200 includes at least two sub-pixels P that are disposed adjacently.

Here, the photosensitive assemblies 10 and the sub-pixels P are arranged in a one-to-many manner. Since the photosensitive assemblies 10 occupy space in the display apparatus, compared with the manner in which the photosensitive assemblies 10 and the sub-pixels P are arranged in the one-to-one correspondence, the manner in which the photosensitive assemblies 10 and the sub-pixels P are arranged in the one-to-many correspondence may reduce the total number of the photosensitive assemblies 10 in the display apparatus. In this way, an aperture ratio of the display apparatus may be increased.

It will be understood that the sub-pixels P in the display apparatus are generally arranged in an array. In some embodiments, the manner in which the photosensitive assemblies 10 and the sub-pixels P are arranged in the one-to-many correspondence may be implemented by referring to any one of the following four types.

Figure 8:
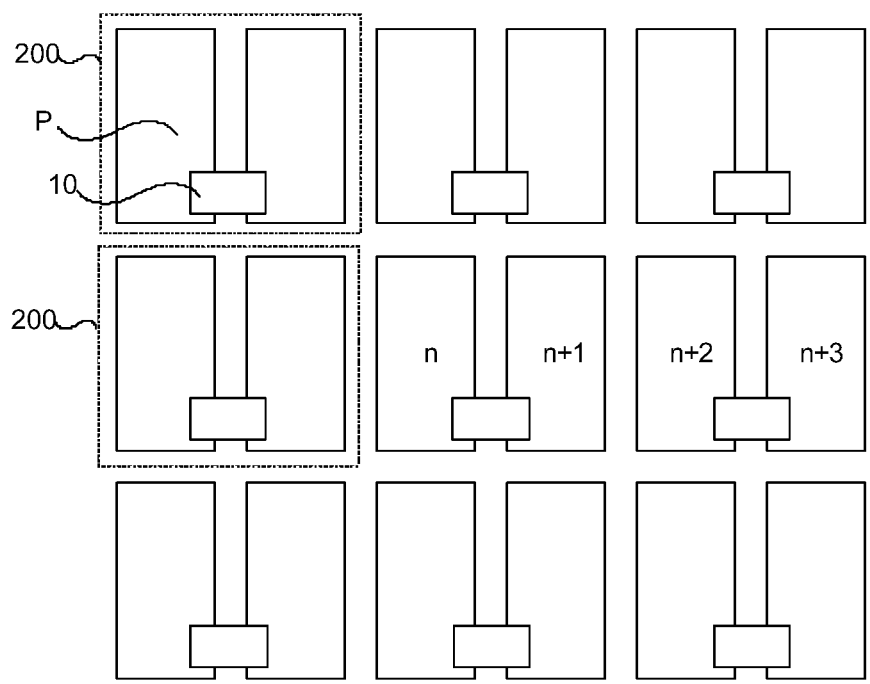
FIG. 8 is another distribution diagram of photosensitive assemblies in a display apparatus, according to some embodiments of the present disclosure.

In a first type, referring to FIG. 8, two adjacent sub-pixels P constitute one sub-pixel group 200 in a row direction of the sub-pixels P, and sub-pixels P in each sub-pixel group 200 share one photosensitive assembly 10. That is, as shown in FIG. 8, in the row direction of the sub-pixels, a nth sub-pixel P and a (n+1)th sub-pixel P constitute one sub-pixel group 200, and the nth sub-pixel P and the (n+1)th sub-pixel P share a same photosensitive assembly 10. A (n+2)th sub-pixel P and a (n+3)th sub-pixel P constitute another sub-pixel group 200, and the (n+2)th sub-pixel P and the (n+3)th sub-pixel P share a same photosensitive assembly 10.

Figure 9:
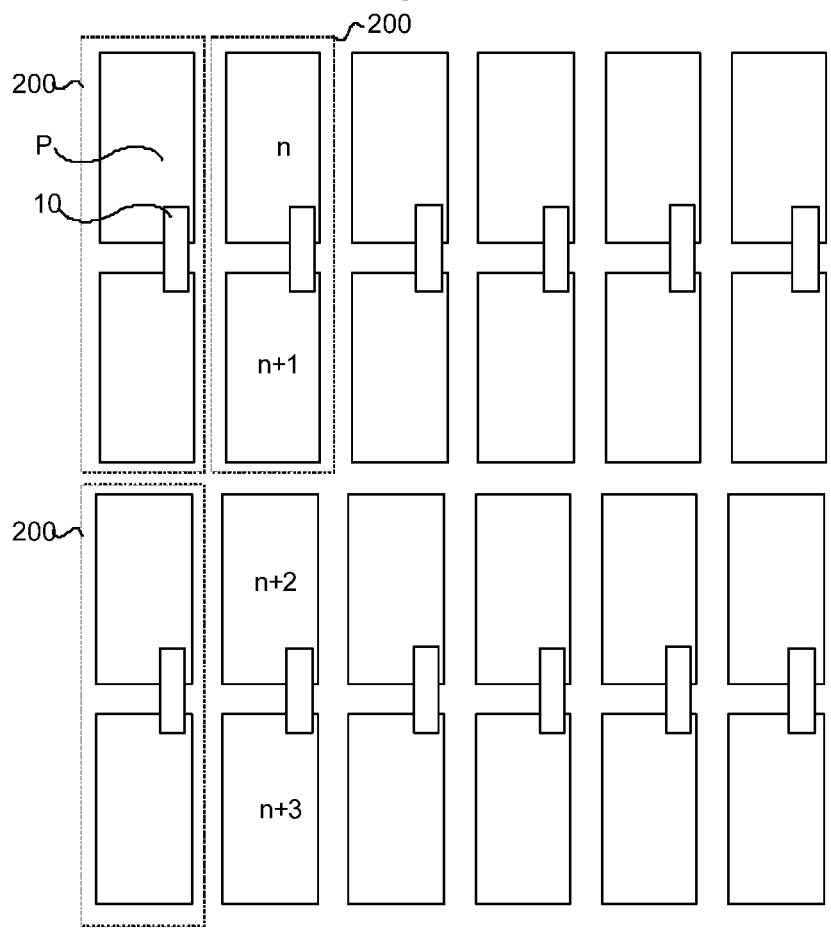
FIG. 9 is another distribution diagram of photosensitive assemblies in a display apparatus, according to some embodiments of the present disclosure.

In a second type, as shown in FIG. 9, two adjacent sub-pixels P constitute one sub-pixel group 200 in a column direction of the sub-pixels P, and sub-pixels P in each sub-pixel group 200 share one photosensitive assembly 10. That is, in the column direction of the sub-pixels P, a nth sub-pixel P and a (n+1)th sub-pixel P constitute one sub-pixel group 200, and the nth sub-pixel P and the (n+1)th sub-pixel P share a same photosensitive assembly 10. A (n+2)th sub-pixel P and a (n+3)th sub-pixel P constitute another sub-pixel group 200, and the (n+2)th sub-pixel P and the (n+3)th sub-pixel P share a same photosensitive assembly 10.

Figure 10:
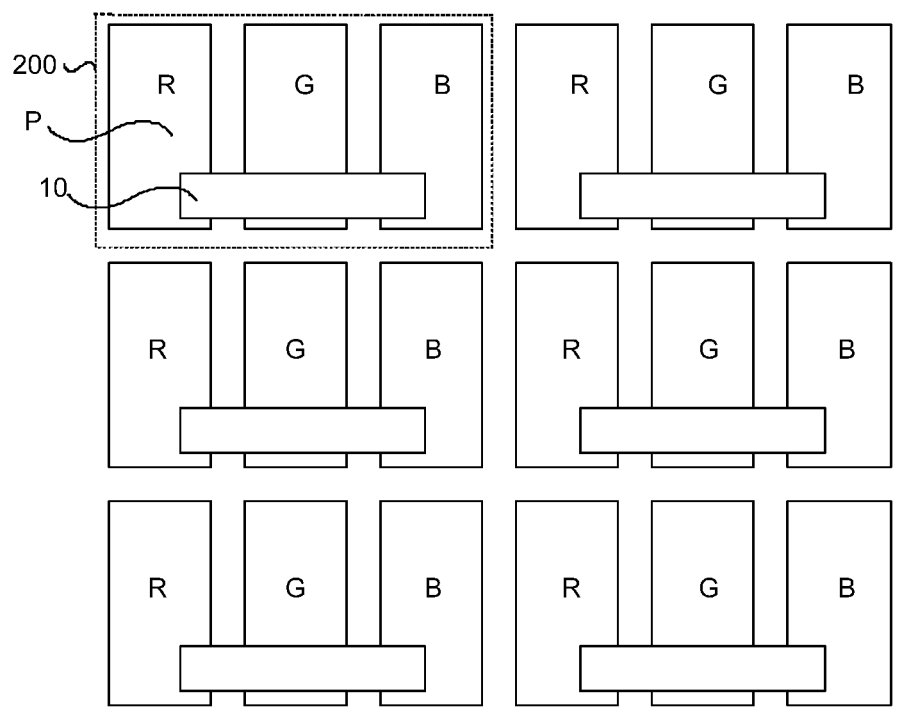
FIG. 10 is another distribution diagram of photosensitive assemblies in a display apparatus, according to some embodiments of the present disclosure.

In a third type, as shown in FIG. 10, three adjacent sub-pixels P constitute one sub-pixel group 200 in the row direction of the sub-pixels P, and three sub-pixels P in each sub-pixel group 200 share a same photosensitive assembly 10.

Figure 11:
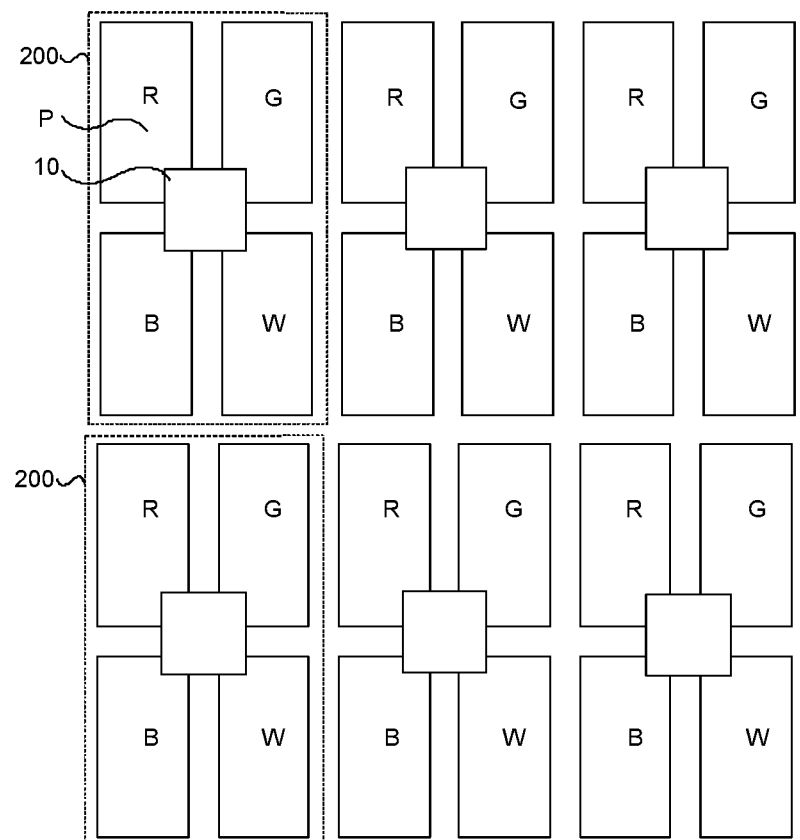
FIG. 11 is another distribution diagram of photosensitive assemblies in a display apparatus, according to some embodiments of the present disclosure.

In a fourth type, as shown in FIG. 11, four adjacent sub-pixels P arranged in a shape of "田" constitute one sub-pixel group 200, and four sub-pixels P in each sub-pixel group 200 share a same photosensitive assembly 10.

Figure 12:
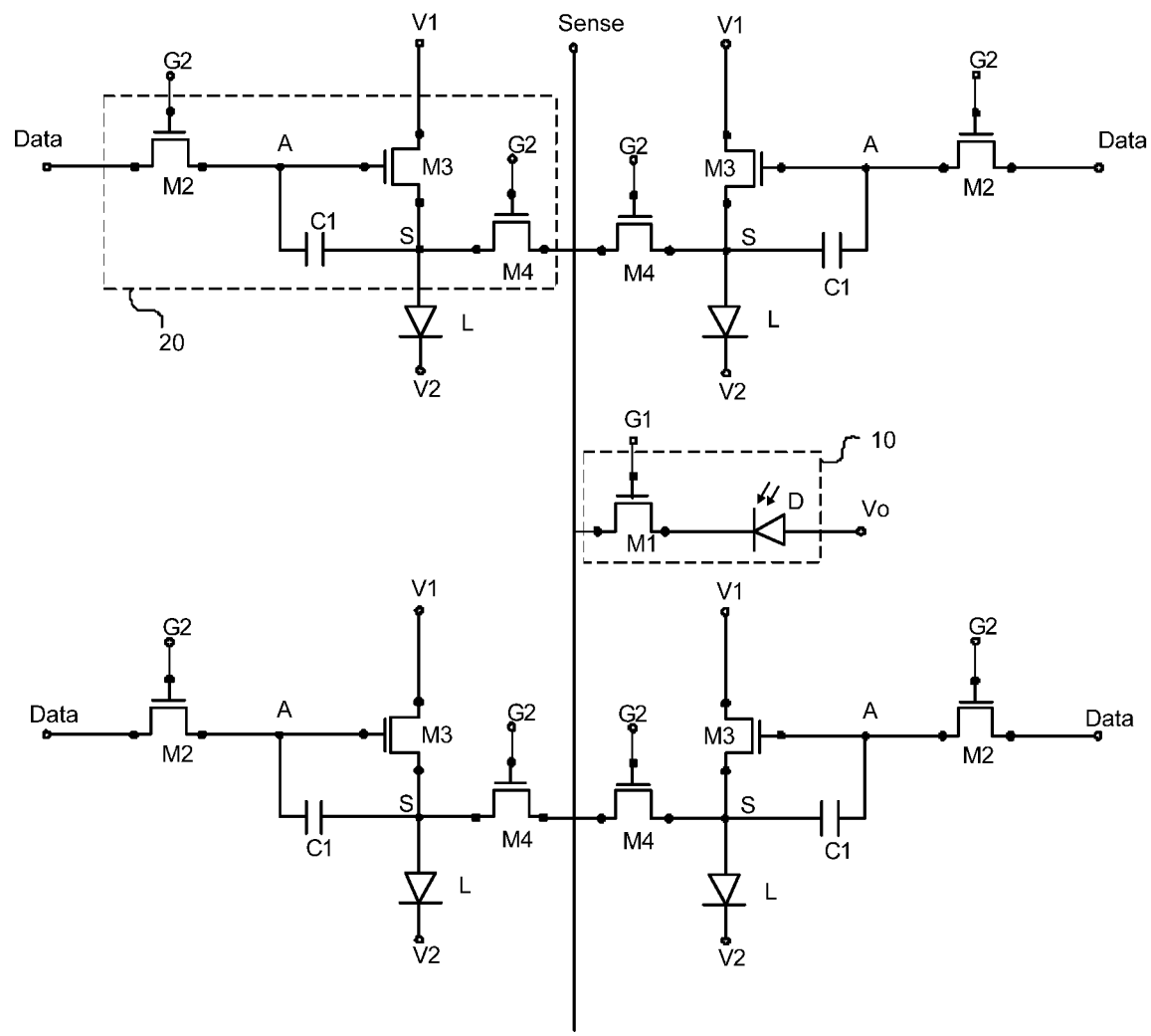
FIG. 12 is a circuit diagram showing a connection of pixel driving circuits and a photosensitive assembly in the display apparatus shown in FIG. 11.

In a case where the photosensitive assemblies 10 and the sub-pixels P adopt the structure shown in FIG. 11, referring to FIG. 12, the pixel driving circuits 20 of the four sub-pixels P in each sub-pixel group 200 are coupled to a same sensing signal line Sense, and the photosensitive assembly 10 shared by the four sub-pixels P is also coupled to the same sensing signal line Sense.

For display apparatuses including the photosensitive assemblies 10 and the sub-pixels P that adopt the structures shown in FIGS. 7 to 10, circuit diagrams showing connections of the photosensitive assemblies 10 and the pixel driving circuits 20 in the corresponding sub-pixels may refer to FIG. 12, and no other drawings are provided herein. It will be understood herein that in some embodiments, sub-pixels P in a same row share a second scanning signal line G2, and signals provided by the second scanning signal line G2 may be used to perform row display control. Sub-pixels in a same column share a data line Data, and signals provided by the data line Data may be used to perform column display control. Photosensitive assemblies 10 in the same row share a first scanning signal line G1, and signals provided by the first scanning signal line G1 may be used to perform light detection control.

It is worth mentioning that, in some embodiments, a division of the sub-pixels to the sub-pixel groups may be performed according to a color display mode of the display apparatus. For example, in a case where the display apparatus adopts a RGB color display mode, each pixel unit of the display apparatus includes a red sub-pixel (R), a green sub-pixel (G), and a blue sub-pixel (B). The red sub-pixel (R), the green sub-pixel (G), and the blue sub-pixel (B) in the pixel unit are usually adjacently arranged. As shown in FIG. 10, each pixel unit corresponds to one sub-pixel group 200. Each photosensitive assembly 10 corresponds to three sub-pixels P in a corresponding sub-pixel group 200, and the three sub-pixels include a red sub-pixel (R), a green sub-pixel (G) and a blue sub-pixel (B).

Or for example, in a case where the display apparatus adopts a RGBW color display mode, each pixel unit of the display apparatus includes a red sub-pixel (R), a green sub-pixel (G), a blue sub-pixel (B), and a white sub-pixel (W). The red sub-pixel (R), the green sub-pixel (G), the blue sub-pixel (B), and the white sub-pixel (W) in the pixel unit are usually adjacently arranged. As shown in FIG. 11, each pixel unit corresponds to one sub-pixel group 200. Each photosensitive assembly 10 corresponds to four sub-pixels P in a corresponding sub-pixel group 200, and the four sub-pixels include a red sub-pixel (R), a green sub-pixel (G), a blue sub-pixel (B), and a white sub-pixel (W).

In some embodiments of the present disclosure, the sub-pixels are divided into the sub-pixel groups 200 according to the pixel unit of the display apparatus, and thus each pixel unit corresponds to one photosensitive assembly 10. In this way, after the actual luminance values of the sub-pixels in different colors in the pixel unit are detected by the photosensitive assembly 10, display compensation maps corresponding to the sub-pixels with different colors may be obtained. Luminance of the sub-pixels in each pixel unit may be compensated, thereby improving an effect of color display of the display apparatus.

In addition, it will also be understood that, for the case where sub-pixels P in the above FIGS. 8 to 11 share the same photosensitive assembly 10, detection of actual luminance values of different sub-pixels P corresponding to the photosensitive assembly 10 needs to be performed by the photosensitive assembly 10 in different periods. For example, a red sub-pixel and an adjacent green sub-pixel share a same photosensitive assembly 10. During a first period, the red sub-pixel emits light, and the photosensitive assembly detects the actual luminance value of the red sub-pixel. During a second period, the green sub-pixel emits light, and the photosensitive assembly detects the actual luminance value of the green sub-pixel. In this way, the same photosensitive assembly 10 detects the actual luminance value of one corresponding sub-pixel P in a time period, thereby ensuring that the photosensitive assembly 10 accurately detects actual luminance values of the corresponding sub-pixels P.

Referring to FIG. 6, a detection process of the actual luminance value of the sub-pixel will be further exemplarily described below. The detection process includes a light-emitting phase and a detection phase.

In the light-emitting phase, a high level is input through the second scanning signal line G2 to control the second transistor M2 and the fourth transistor M4 to be turned on. In this case, a signal Vdata transmitted by the data line Data is written to the first node A, and a reference voltage Vref (e.g., 0V) transmitted by the sensing signal line Sense is written to the second node S. In this way, the voltages at two ends of the storage capacitor C1 are fixed. Next, a low level is input through the second scanning signal line G2 to control the second transistor M2 and the fourth transistor M4 to be turned off. The third transistor M3 is turned on under control of the storage capacitor C1. A high level (e.g., OVDD) is input via the first voltage terminal V1 to charge the second node S, and then a potential at the second node S rises. A low level (e.g., OVSS) is input via the second voltage terminal V2. When the potential at the second node S rises to a voltage that is equal to the sum of the OVSS and the light-emitting driving voltage of the light-emitting device L (i.e., OVSS+Voled), the light-emitting device L starts to emit light.

In a period that the potential at the second node S rises, due to a coupling effect of the storage capacitor C1, a voltage at the first node A also rises by a same voltage value accordingly. A voltage difference Vgs between the control electrode of the third transistor M3 and the second electrode of the third transistor M3 (i.e., a voltage difference between a gate electrode and a source electrode) remains unchanged. Therefore, in the light-emitting phase, the pixel driving circuit with the structure shown in FIG. 6 may effectively compensate resistance voltage drop (IR Drop) of the second voltage terminal V2.

In the detection phase, for the sub-pixels P corresponding to the photosensitive assembly 10 that are emitting light, a high level is input through the first scanning signal line G1 to control the first transistor M1 to be turned on. In this case, the photosensitive device D in the photosensitive assembly 10 detects an actual luminance value of the light-emitting device L, and outputs an electric signal corresponding to the actual luminance value. The sensing signal line Sense coupled to the output terminal of the photosensitive assembly 10 transmits the electric signal to the detecting integrated circuit. The detecting integrated circuit performs conversion of the electric signal, and storage and output of the converted electric signal. It will be understood that, for the case where sub-pixels P share the same photosensitive assembly 10, the sub-pixels may separately emit light and be detected in different time periods. For example, as shown in FIGS. 11 and 12, in a case where four sub-pixels share one photosensitive assembly 10, in the light-emitting phase, among the four sub-pixels corresponding to the photosensitive assembly, the light-emitting device L in one of the four sub-pixels emits light, and the light-emitting devices L in the other three sub-pixels are all in a turn-off state. After luminance detection of the sub-pixel, the other three sub-pixels separately emit light and are detected.

After the light-emitting phase and the detection phase in the detecting process, the detected actual luminance value of the target sub-pixel in the display apparatus may be output to the processor. Obtained data are processed by the processor to obtain the display compensation map corresponding to the target sub-pixel. In this way, during the actual display process of the display apparatus (i.e., a display phase of the target sub-pixel), according to the display compensation map, the timing controller may output a compensated display datum corresponding to an initial display datum to the data driving circuit, so as to apply a corresponding pixel voltage to the target sub-pixel. Luminance adjustment of the target sub-pixel may be achieved, and a problem of the Mura of the display apparatus may be solved.

Figure 13:
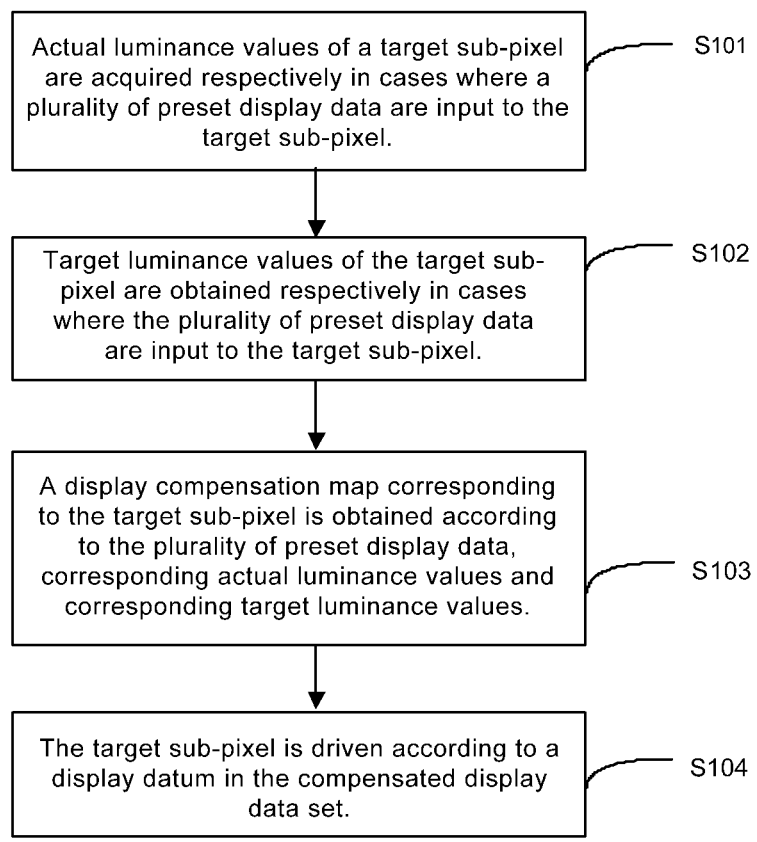
FIG. 13 is a flow diagram of a control method of a display apparatus, according to some embodiments of the present disclosure.

Some embodiments of the present disclosure provide a control method of a display apparatus. As shown in FIG. 13, the control method includes step 101 to step 104 (S101 to S104).

In S101, actual luminance values of a target sub-pixel are acquired respectively in cases where a plurality of preset display data are input to the target sub-pixel.

Optionally, the plurality of preset display data are display data corresponding to a plurality of gamma reference voltages. The gamma reference voltages are in a one-to-one correspondence with gray scales, and different gray scales correspond to different display data. The S101 includes: acquiring the actual luminance value of the target sub-pixel in a case where a preset display datum corresponding to each of the plurality of gamma reference voltages is input to the target sub-pixel. For example, the preset display data corresponding to the plurality of gamma reference voltages are display data corresponding to gray value 0, gray value 63, gray value 127, and gray value 255. Embodiments of the present disclosure are not limited thereto.

In S102, target luminance values of the target sub-pixel are obtained respectively in cases where the plurality of preset display data are input to the target sub-pixel.

In S103, a display compensation map corresponding to the target sub-pixel is obtained according to the plurality of preset display data, the actual luminance values corresponding to the preset display data, and the target luminance values corresponding to the preset display data. The display compensation map reflects a correspondence relationship between an initial display data set and a compensated display data set.

In S104, the target sub-pixel is driven according to a compensated display datum in the compensated display data set.

The control method provided by some embodiments of the present disclosure corresponds to the display apparatuses provided by some embodiments described above, and has the same beneficial effects as the above described display apparatuses. Since some embodiments described above have already described the beneficial effects of the display apparatus in detail, the beneficial effects will be not described herein again.

In some embodiments, the S103, in which a display compensation map corresponding to the target sub-pixel is obtained according to the preset display data, the actual luminance values corresponding to the preset display data and the target luminance values corresponding to the preset display data, includes:

S1031: fitting an actual luminance value curve of the target sub-pixel according to a correspondence relationship between each preset display datum and a corresponding actual luminance value.

S1032: fitting a target luminance value curve of the target sub-pixel according to a correspondence relationship between each preset display datum and a corresponding target luminance value.

S1033: obtaining a target luminance value corresponding to each initial display datum in the initial display data set from the target luminance value curve;

and obtaining, from the actual luminance value curve, a display datum corresponding to an actual luminance value that is equal to the target luminance value, as a compensated display datum corresponding to the initial display datum; wherein compensated display data corresponding to initial display data constitute the compensated display data set.

In some embodiments, the target luminance value of the target sub-pixel obtained in a case where each preset display datum is input to the target sub-pixel may be obtained in various ways.

For example, the target luminance value corresponding to each preset display datum is a luminance value corresponding to each preset display datum in a gamma curve (e.g., Gamma curve 2.2).

Or for example, the target luminance value corresponding to each preset display datum is an average luminance value of a plurality of actual luminance values, which are within a first luminance value range, in actual luminance values of a plurality of sub-pixels with a same color as the target sub-pixel, and the actual luminance values of the plurality of sub-pixels are obtained respectively in cases where the same preset display datum is input to the plurality of sub-pixels. The first luminance value range is, in a plurality of preset luminance value ranges, a luminance value range in which actual luminance values of the plurality of sub-pixels with a same color as the target sub-pixel are mainly concentrated.

For example, a red sub-pixel in the display apparatus is considered as the target sub-pixel. A luminance value range of the red target sub-pixel is preset. The luminance value range of the red target sub-pixel is divided into five ranges, i.e., less than 55, 55 to 75, 75 to 95, 95 to 115, and greater than 115. A preset display datum is input to a plurality of other red sub-pixels in the display apparatus. The actual luminance values corresponding to the other red sub-pixels are 60, 80, 80, 90, 90, 90, and 120 (in practice, a distribution of actual luminance values generally shows a trend of normal distribution). In this case, the actual luminance values of the respective red sub-pixels are mainly concentrated in a luminance value range that is 75 to 95. This luminance value range is the first luminance value range. Therefore, an average luminance value (i.e., 86) of the actual luminance values (i.e., 80, 80, 90, 90, and 90) in the first luminance value range is used as the target luminance value of the red target sub-pixel. Here, for all red sub-pixels in the display apparatus, the average luminance value (i.e., 86) may be used as their target luminance value. Thus, red sub-pixels with a luminance value less than 86 may be positively compensated. That is, a pixel voltage is applied to a corresponding red sub-pixel, so that its luminance value is 86. Red sub-pixels with a luminance value greater than 86 may be negatively compensated. That is, a pixel voltage is applied to a corresponding red sub-pixel, so that its luminance value is 86. Of course, the values herein are merely illustrative.

Or for example, the target luminance value corresponding to each preset display datum is an average luminance value of the actual luminance values of a plurality of sub-pixels with a same color as the target sub-pixel, and the actual luminance values are acquired respectively in cases where a same preset display datum is input to the plurality of sub-pixels with a same color as the target sub-pixel. For example, a green sub-pixel in the display apparatus is regarded as the target sub-pixel. A preset display datum is input to a plurality of other green sub-pixels in the display apparatus. The actual luminance values corresponding to the other green sub-pixels are 60, 80, 80, 90, 90, 90, and 120. An average value (i.e., 87) of the group of the actual luminance values may be used as the target luminance value of the green target sub-pixel. In addition, the average value (i.e., 87) may also be used as the target luminance value of all green sub-pixels in the display apparatus corresponding to the same preset display datum.

It will be understood that, for all sub-pixels with a same color as the target sub-pixel in the display apparatus, the target luminance value of the target sub-pixel obtained in a case where a preset display datum is input to the target sub-pixel may be used as the target luminance value of each sub-pixel with the same color as the target sub-pixel in a case where the same preset display datum is input to the sub-pixel with the same color as the target sub-pixel.

Some embodiments of the present disclosure do not specifically limit the selection of the target luminance value. In practice, the target luminance value may be selected and set as needs. Of course, in a case where different types of target luminance values are selected, the display compensation maps corresponding to the target luminance values may be different.

On this basis, in an example where the target luminance value of the target sub-pixel obtained in a case where a preset display datum is input to the target sub-pixel is a luminance value corresponding to the preset display datum on the gamma curve, a specific process of obtaining a display compensation map corresponding to the target sub-pixel in the S103 will be described in detail.

Figure 14:
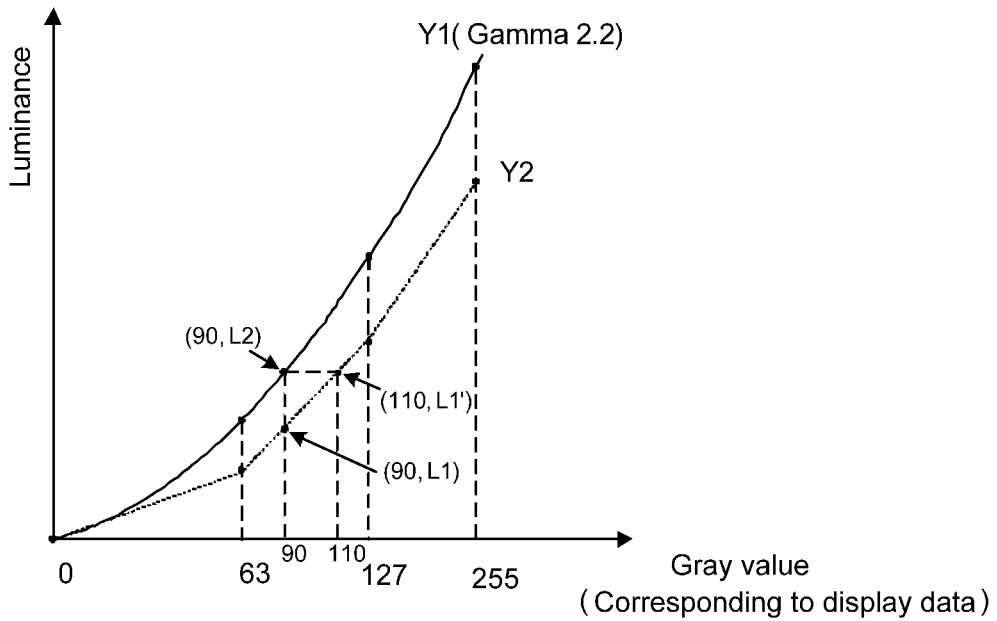
FIG. 14 is a diagram showing a correspondence relationship between a target luminance value curve and an actual luminance value curve, according to some embodiments of the present disclosure.

Referring to FIG. 14, Y1 is Gamma curve 2.2 (Gamma 2.2). The Gamma curve 2.2 is a known curve. When the Gamma curve 2.2 is used as the target luminance value curve of the target sub-pixel, luminance values on the Gamma curve 2.2 corresponding to the preset display data may be used as the target luminance values of the target sub-pixel.

The gray values (such as gray value 0, gray value 63, gray value 127, and gray value 255) corresponding to the plurality of gamma reference voltages are selected as the preset display data. The actual luminance values of the target sub-pixel corresponding to the preset display data (such as, the gray value 0, the gray value 63, the gray value 127, and the gray value 255) are acquired, and the actual luminance values are connected in sequence to form a broken line, which is used as actual luminance curve Y2 corresponding to the target sub-pixel. In this way, an actual luminance value of the target sub-pixel may be acquired in a case where each initial display datum is input to the target sub-pixel, according to a function corresponding to any part of the actual luminance curve Y2 (for example, a part of the actual luminance curve Y2 corresponding to abscissas that are 0 to 63, a part of the actual luminance curve Y2 corresponding to abscissas that are 63 to 127, or a part of the actual luminance curve Y2 corresponding to abscissas that are 127 to 255).

It will be noted that the horizontal axis in FIG. 14 represents the gray values corresponding to the target sub-pixel. Each gray value corresponds to a display datum. The vertical axis in FIG. 14 represents the luminance values corresponding to the target sub-pixel. Therefore, a correspondence relationship between the display data corresponding to the gray values and the luminance values may be obtained according to a correspondence relationship between the gray values and the luminance values in FIG. 14.

In this case, with continued reference to FIG. 14, it is assumed that, in an actual display process, the initial display datum input to the target sub-pixel is a display datum corresponding to gray value 90 in a range from the gray value 63 to the gray value 127. In a case where the luminance of the target sub-pixel is not compensated, it can be seen from the actual luminance curve Y2 that the actual luminance value of the target sub-pixel is L1. In addition, it can be seen from the target luminance curve Y1 that the target luminance value of the target sub-pixel is L2 in a case where the display datum corresponding to the gray value 90 is input to the target sub-pixel. As will be seen from FIG. 14, the target sub-pixel needs a luminance compensation because of a large difference between the actual luminance value L1 of the target sub-pixel and the target luminance value L2 of the target sub-pixel.

Thus, a luminance value L1' equal to the target luminance value L2 of the target sub-pixel is used as an actual luminance value, and a gray value corresponding to the luminance value L1' is obtained from the actual luminance curve Y2. For example, the gray value 110 shown in FIG. 14 (that is, a gray scale obtained by substituting L2 or L1' into a function corresponding to a part of Y2 where abscissas are in a range from 63 to 127). The display datum corresponding to the gray value 110 may be used as the compensated display datum obtained after the initial display datum is compensated. In this case, the luminance value L1' corresponding to the compensated display datum is equal to the target luminance value L2. In this way, a corresponding relationship between each initial display datum in the value range of the display data of the target sub-pixel and a corresponding compensated display datum may be obtained according to Y1 and Y2. Thus, the luminance of the target sub-pixel is compensated according to the display compensation map corresponding to the target sub-pixel. The problem of the Mura of the display apparatus may be solved. Of course, the description herein is made only by taking an example in which the display datum corresponding to the gray value 90 is used as the initial display datum. Compensated display data corresponding to other initial display data may be obtained by referring to the foregoing process, which will not be described herein again.

Figure 15:
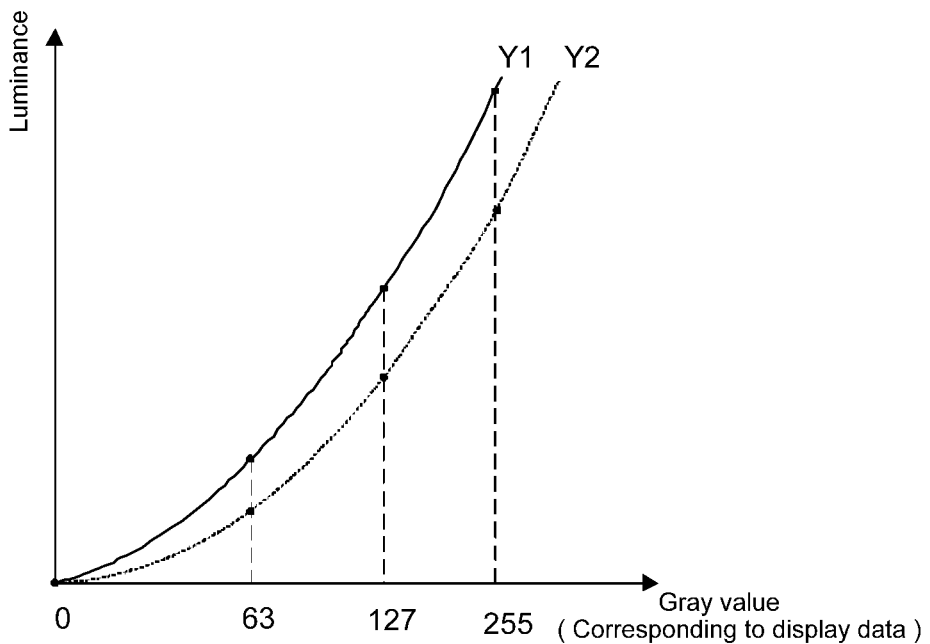
FIG. 15 is a diagram showing another correspondence relationship between a target luminance value curve and an actual luminance value curve, according to some embodiments of the present disclosure.

In addition, in some embodiments, the actual luminance value curve Y2 may be fitted with reference to the type of the curve Y1, and a smooth curve (i.e., the actual luminance curve Y2 in FIG. 15) is obtained after the actual luminance value curve Y2 is fitted in the value range of display data corresponding to the target sub-pixel. In this way, the accuracy of the display compensation map may be improved. Therefore, after luminance compensation for the target sub-pixel is performed according to the compensated display data obtained by using the display compensation map, the luminance of the target sub-pixel is very close to the target luminance. Of course, the actual luminance value curve of the target sub-pixel may also be fitted with reference to other types of curves according to actual compensation requirements, which is not limited in some embodiments of the present disclosure, and in practice, an appropriate fitting manner may be selected according to requirements.

In some embodiments, the S101, in which actual luminance values of a target sub-pixel are acquired respectively in cases where the plurality of preset display data are input to the target sub-pixel, includes: according to a preset condition, acquiring, the actual luminance values of the target sub-pixel in cases where the preset display data are input to the target sub-pixel. The preset condition may be set according to an actual luminance compensation requirement of the display apparatus. The preset condition may be set to perform the above step, for example, at the time when the display apparatus is turned on, at the time when the display apparatus is turned off, or at a preset time in each day or each month. Some embodiments of the present disclosure are not limited thereto.

In this way, the display apparatus acquires the actual luminance values of the target sub-pixel in cases where the plurality of preset display data are input to the target sub-pixel according to the preset condition, and then the display apparatus may update the display compensation map corresponding to the target sub-pixel at intervals. Thereby, the display apparatus may compensate the luminance of the target sub-pixel according to a latest display compensation map of the target sub-pixel, so as to prevent the display apparatus from using a same display compensation map for a long time. Furthermore, the accuracy of the target sub-pixel luminance compensation may be improved, and an image displayed by the display apparatus may always have better luminance uniformity.

In the description of the above embodiments, specific features, structures, materials or characteristics may be combined in an appropriate manner in any one or more embodiments or examples.

Some embodiments of the present disclosure further provide a computer product including one or more processors. The one or more processors are configured to execute computer instructions, so as to perform one or more steps in the control method of the display apparatus described above.

Some embodiments of the present disclosure provide a computer non-transitory readable storage medium. The computer non-transitory readable storage medium stores computer instructions, and the computer instructions are configured to perform the control method of the display apparatus described above.

Some embodiments of the present disclosure provide a computer program. When the computer program is loaded into a processor, the processor is caused to perform the control method of the display apparatus described above.

Some embodiments of the present disclosure may be implemented in whole or in part by software, hardware, firmware, or any combination thereof. When some embodiments of the present disclosure are implemented by using a software program, a form of a computer program product may appear in whole or in part. The computer program product includes one or more computer instructions. When the computer program instructions are loaded and executed on a computer, the processes or functions described according to embodiments of the present invention are generated in whole or in part. The computer may be a general purpose computer, a special purpose computer, a computer network, or any other programmable device. The computer instructions may be stored in a computer readable storage medium or transferred from one computer readable storage medium to another computer readable storage medium, for example, the computer instructions may be transferred from a website site, computer, server or data center to another website site, computer, server, or data center by means of wire (e.g., a coaxial cable, an optical fiber, a digital subscriber line (DSL)), or wireless (e.g., infrared, wireless, microwave). The computer readable storage medium may be any available medium that may be accessed by a computer, or a data storage device such as a server or a data center including one or more available media. The available medium may be a magnetic medium (e.g., a floppy disk, a hard disk, a magnetic tape), an optical medium (e.g., a DVD), a semiconductor medium (e.g., a solid state disk (SSD)) or the like.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display apparatus, comprising:
   a plurality of sub-pixels;
   at least one photosensitive assembly, each photosensitive assembly being configured to detect and output actual luminance value(s) of at least one sub-pixel; and
   a processor configured to obtain a display compensation map corresponding to a target sub-pixel according to actual luminance values of the target sub-pixel that are acquired respectively in cases where a plurality of preset display data are input to the target sub-pixel, and target luminance values of the target sub-pixel that are obtained respectively in cases where the plurality of preset display data are input to the target sub-pixel, wherein the display compensation map reflects a correspondence relationship between each initial display datum in an initial display data set and a corresponding compensated display datum in a compensated display data set, and the target sub-pixel is any one of the plurality of sub-pixels; wherein the processor is further configured to
   fit an actual luminance value curve of the target sub-pixel according to a correspondence relationship between each preset display datum and a corresponding actual luminance value;
   fit a target luminance value curve of the target sub-pixel according to a correspondence relationship between each preset display datum and a corresponding target luminance value;
   obtain a target luminance value corresponding to each initial display datum in the initial display data set from the target luminance value curve; and
   obtain, from the actual luminance value curve, a display datum corresponding to an actual luminance value that is equal to the target luminance value, as a compensated display datum corresponding to the initial display datum.

2. The display apparatus according to claim 1, further comprising:
   a timing controller coupled to the processor, wherein the timing controller is configured to, according to the display compensation map and an initial display datum in the initial display data set, output a corresponding compensated display datum in the compensated display data set during a display phase of the target sub-pixel; and a data driving circuit coupled to the timing controller, wherein the data driving circuit is configured to apply a pixel voltage to the target sub-pixel according to the corresponding compensated display datum in the compensated display data set.

3. The display apparatus according to claim 1, further comprising a detecting integrated circuit, wherein the detecting integrated circuit is coupled to the at least one photosensitive assembly and the processor, and the detecting integrated circuit is configured to output actual luminance values output by the at least one photosensitive assembly to the processor.

4. The display apparatus according to claim 1, wherein each photosensitive assembly includes:
a photosensitive device, wherein a photosensitive region of the photosensitive device is at least partially opposite to a light exit region of the at least one sub-pixel; and
a first transistor, wherein a control electrode of the first transistor is coupled to a first scanning signal line, a first electrode of the first transistor is coupled to the photosensitive device, and a second electrode of the first transistor is coupled to an output terminal of the photosensitive assembly.

5. The display apparatus according to claim 4, wherein the photosensitive device includes a PIN photodiode.

6. The display apparatus according to claim 1, wherein each of the plurality of sub-pixels includes a light-emitting device and a pixel driving circuit coupled to the light-emitting device; and
the pixel driving circuit includes:
a second transistor, wherein a control electrode of the second transistor is coupled to a second scanning signal line, a first electrode of the second transistor is coupled to a data line, and a second electrode of the second transistor is coupled to a first node;
a third transistor, wherein a control electrode of the third transistor is coupled to the first node, a first electrode of the third transistor is coupled to a first voltage terminal, and a second electrode of the third transistor is coupled to a second node;
a fourth transistor, wherein a control electrode of the fourth transistor is coupled to the second scanning signal line, a first electrode of the fourth transistor is coupled to the second node, and a second electrode of the fourth transistor is coupled to a sensing signal line; and
a storage capacitor, wherein one end of the storage capacitor is coupled to the first node, and another end of the storage capacitor is coupled to the second node,
wherein a first electrode of the light-emitting device is coupled to the second node, and a second electrode of the light-emitting device is coupled to a second voltage terminal.

7. The display apparatus according to claim 6, wherein each photosensitive assembly is coupled to a detecting integrated circuit through a sensing signal line that is coupled to pixel driving circuit(s) in corresponding sub-pixel(s).

8. The display apparatus according to claim 1, wherein each sub-pixel corresponds to one photosensitive assembly; or
the plurality of sub-pixels include at least one sub-pixel group, and each sub-pixel group corresponds to one photosensitive assembly, wherein each sub-pixel group includes at least two sub-pixels that are adjacently arranged.

9. The display apparatus according to claim 1, wherein each photosensitive assembly corresponds to three sub-pixels that are adjacently arranged, and the three sub-pixels include a red sub-pixel, a blue sub-pixel, and a green sub-pixel; or
each photosensitive assembly corresponds to four sub-pixels that are adjacently arranged, and the four sub-pixels include a red sub-pixel, a blue sub-pixel, a green sub-pixel, and a white sub-pixel.

10. The display apparatus according to claim 4, wherein the second electrode of the first transistor in the photosensitive assembly is coupled to a detecting integrated circuit through a sensing signal line.

11. The display apparatus according to claim 6, wherein pixel driving circuit(s) in the at least one sub-pixel are coupled to a corresponding photosensitive assembly through a sensing signal line.

12. A control method of a display apparatus, the control method comprising:
acquiring actual luminance values of a target sub-pixel respectively in cases where a plurality of preset display data are input to the target sub-pixel;
obtaining target luminance values of the target sub-pixel respectively in cases where the plurality of preset display data are input to the target sub-pixel; and
obtaining a display compensation map corresponding to the target sub-pixel according to the plurality of preset display data, the actual luminance values corresponding to the plurality of preset display data and the target luminance values corresponding to the plurality of preset display data, wherein the display compensation map reflects a correspondence relationship between each initial display datum in an initial display data set and a corresponding display datum in a compensated display data set, and the target sub-pixel is any one of the plurality of sub-pixels; wherein obtaining the display compensation map corresponding to the target sub-pixel according to the plurality of preset display data, the actual luminance values corresponding to the plurality of preset display data and the target luminance values corresponding to the plurality of preset display data, includes:
fitting an actual luminance value curve of the target sub-pixel according to a correspondence relationship between each preset display datum and a corresponding actual luminance value;
fitting a target luminance value curve of the target sub-pixel according to a correspondence relationship between each preset display datum and a corresponding target luminance value;
obtaining a target luminance value corresponding to each initial display datum in the initial display data set from the target luminance curve;
and obtaining, from the actual luminance value curve, a display datum corresponding to an actual luminance value that is equal to the target luminance value, as a compensated display datum corresponding to the initial display datum; wherein compensated display data corresponding to initial display data constitute the compensated display data set.

13. The control method of the display apparatus according to claim 12, wherein each preset display data is a display datum corresponding to a gamma reference voltage.

14. The control method of the display apparatus according to claim 12, wherein the target luminance values of the target sub-pixel obtained respectively in cases where the plurality of preset display data are input to the target sub-pixel, includes:
- a luminance value corresponding to each preset display datum on a gamma curve;
- an average luminance value of actual luminance values, which are within a first luminance value range, in a plurality of actual luminance values acquired respectively in cases where a preset display datum is input to a plurality of sub-pixels with a same color as the target sub-pixel, the first luminance value range includes, in a plurality of preset luminance value ranges, a luminance value range in which actual luminance values of the plurality of sub-pixels with a same color as the target sub-pixel are concentrated; or
- an average luminance value of the plurality of actual luminance values acquired respectively in cases where a preset display datum is input to the plurality of sub-pixels with a same color as the target sub-pixel.

15. The control method of the display apparatus according to claim 12, wherein acquiring actual luminance values of a target sub-pixel respectively in cases where a plurality of preset display data are input to the target sub-pixel, includes
- according to a preset condition, acquiring the actual luminance values of the target sub-pixel respectively in cases where the plurality of preset display data are input to the target sub-pixel.

16. The control method of the display apparatus according to claim 12, further comprising: driving the target sub-pixel according to a compensated display datum in the compensated display data set.

17. A non-transitory computer readable storage medium, the non-transitory computer readable storage medium storing computer instructions configured to be executed by a processor of a display apparatus, and the computer instructions, when executed by the processor, implementing the control method according to claim 12.

* * * * *